United States Patent [19]
Burton et al.

[11] Patent Number: 6,121,134
[45] Date of Patent: Sep. 19, 2000

[54] HIGH ASPECT RATIO METALLIZATION STRUCTURES AND PROCESSES FOR FABRICATING THE SAME

[75] Inventors: Randle D. Burton; Shane Leiphart, both of Boise, Id.

[73] Assignee: Micron Technology, Inc., Boise, Id.

[21] Appl. No.: 09/063,608

[22] Filed: Apr. 21, 1998

[51] Int. Cl.$^7$ .................................................. H01L 21/44
[52] U.S. Cl. .......................... 438/652; 438/622; 438/642
[58] Field of Search ............................. 257/753; 438/627, 438/643, 653, 652

[56] References Cited

U.S. PATENT DOCUMENTS

| | | |
|---|---|---|
| 4,394,400 | 7/1983 | Green et al. . |
| 4,481,230 | 11/1984 | Hanak . |
| 4,996,581 | 2/1991 | Hamasaki . |
| 5,079,180 | 1/1992 | Rodder et al. . |
| 5,144,143 | 9/1992 | Raspagliesi et al. . |
| 5,198,372 | 3/1993 | Verret . |
| 5,232,874 | 8/1993 | Rhodes et al. . |
| 5,240,739 | 8/1993 | Doan et al. . |
| 5,256,245 | 10/1993 | Keller et al. . |
| 5,278,100 | 1/1994 | Doan et al. . |
| 5,409,853 | 4/1995 | Yu . |
| 5,431,794 | 7/1995 | Matsumaru et al. . |
| 5,462,890 | 10/1995 | Hwang et al. . |
| 5,773,890 | 6/1998 | Uchiyama et al. ...................... 257/753 |
| 5,877,086 | 3/1999 | Aruga ...................................... 438/653 |
| 5,895,267 | 4/1999 | Zhao et al. ............................... 438/627 |
| 5,913,145 | 6/1999 | Lu et al. ................................... 438/643 |

OTHER PUBLICATIONS

Mayo, et al. "Across–Wafer Nonuniformity of Long–Throw Sputter Deposition." 43$^{rd}$ National Symposium, Abstracts, Oct. 14–18, 1996.

IMP Program Team, "Deposition of Ti and TiN using Vectra–IMP Source with Biasable 101 Heater; the Latest in Barrier and Liner Technology."

Hogan, et al., "Tailoring Titanium Silicide Formation through Ionized Metal Plasma Titanium Deposition" (Applied Materials internal publication).

Dixit, et al., "Ion Metal Plasma (IMP) Titanium Liners for 0.25 and 0.18 μm Multilevel Interconnects," IEDM International Electron Devices Metting, Dec. 1996.

Rossnagle, et al., "Magnetron sputter deposition with high levels of metal ionization." Appl. Phys. Lett. 63 (24), Dec. 13, 1993.

"Applied Materials on CVD roll; chemical vapor deposition products; Product Announcement." Section No. 2146, vol. 42; p. 53, Dec. 9, 1996.

"Applied Materials introduces Endura HP Liner/Barrier systems," M2 Press Wire, Dec. 5, 1996.

"To Fill Deep Device Vias, Ionize Sputtered Materials; Thin Film Technology," Section 13, vol. 38; p. S23, Dec. 1996.

"Applied Materials Launches New Metallization Technology; Vectra Source for Ion Metal Plasma Extends PVD Contact and Via Fill Capability to 0.25 micron and beyond," Business Wire, Jul. 12, 1996.

*Primary Examiner*—Matthew Smith
*Assistant Examiner*—Calvin Lee
*Attorney, Agent, or Firm*—Trask Britt

[57] ABSTRACT

A contact interface having a substantially continuous profile along a bottom and lower sides of the active surface of the semiconductor substrate formed within a contact opening. The contact interface is formed by depositing a layer of conductive material, such as titanium, using both a high bias deposition and a low bias deposition. The high bias and low bias deposition may be effected as a two-step deposition or may be accomplished by changing the bias from a high level to a low level during deposition, or vice versa. The conductive material is converted to a silicide by an annealing process to form the contact interface.

19 Claims, 11 Drawing Sheets

HIGH ASPECT RATIO METALLIZATION STRUCTURES AND PROCESSES FOR FABRICATING THE SAME

BACKGROUND OF THE INVENTION

1. Field of the Invention

The present invention relates to a contact interface within a contact opening, which contact interface is in electrical communication with an active surface of a semiconductor substrate, and methods of forming the same. More particularly, the present invention relates to altering an Ionized Metal Plasma ("IMP") process to form a contact interface having a substantially uniform profile along a bottom and sides of the active surface of the semiconductor substrate within the contact opening.

2. State of the Art

In the processing of integrated circuits, electrical contact must be made to isolated active-device regions formed within a semiconductor substrate, such as a silicon wafer. Such active-device regions may include p-type and n-type source and drain regions used in the production of NMOS, PMOS, and CMOS structures for production of DRAM chips and the like. The active-device regions are connected by conductive paths or lines which are fabricated above an insulative or dielectric material covering a surface of the semiconductor substrate. To provide electrical connection between a conductive path and active-device regions, openings in the insulative material are generally provided to enable a deposited conductive material to contact the desired regions, thereby forming a "contact." The openings in the insulative material are typically referred to as "contact openings."

Higher performance, lower cost, increased miniaturization of components, and greater packaging density of integrated circuits are goals of the computer industry. However, as components become smaller and smaller, tolerances for all semiconductor structures (such as circuitry traces, contacts, and the like) become more and more stringent. In fact, each new generation of semiconductor device technology has seen a reduction in contact size of, on average, about 0.7 times. Unfortunately, interconnect delays have also increased at a rate of about two times per each new generation. Interconnect delays have a limiting effect on clock speeds which lowers performance. Although the reduction in size creates technical problems, the future advancement of the technology requires the capability for forming sub–0.25 $\mu$m contact openings with aspect ratios (height to width) as high as 8 to 1.

Moreover, the reduction in contact size (i.e., diameter) has resulted in intolerable increases in resistance between the active-device regions and the conductive material. Various methods have been employed to reduce the contact resistance at the interface between the conductive material and active-device region. One such method includes the formation of a metal silicide contact interface atop the active-device region within the contact opening prior to the application of the conductive material into the contact opening. A common metal silicide material formed is titanium silicide ($TiSi_x$, wherein x is predominately equal to 2) generated from a deposited layer of titanium.

FIGS. 14–18 illustrate a conventional method of forming a titanium silicide layer on an active-device region. FIG. 14 illustrates an intermediate structure 300 comprising a semiconductor substrate 302 having an active-device region 304 formed therein with a dielectric layer 306 disposed thereover. A contact opening 308 is formed, by any known technique, such as patterning of a photoresist and subsequent etching, in the dielectric layer 306 to expose a portion of the active-device region 304, as shown in FIG. 15. A thin layer of titanium 310 is applied over the dielectric layer 306 and the exposed portion of the active-device region 304, as shown in FIG. 16. A high temperature anneal step is conducted in an inert atmosphere to react the thin titanium layer 310 with the active-device region 304 in contact therewith which forms a titanium silicide layer 312, as shown in FIG. 17. The non-reacted titanium layer 310 may then be removed to result in a final structure 314 with a titanium silicide layer 312 formed therein, as shown in FIG. 18.

Although this method is very effective in forming such titanium silicide layers on active-device regions, the aforementioned reduction in size (i.e., diameter) of the contact openings has made it difficult for a titanium layer to be deposited in such contact openings. It is, of course, understood that the titanium (or other such conductive material) layer must exhibit good coverage at the bottom of the contact opening (exposed portion of the active-device region 304 in FIG. 17) to maximize the contact area of the subsequently formed titanium silicide. Therefore, both bottom and sidewall step coverage and the continuity of the titanium film (or other such conductive material) must be considered.

Naturally, as contact opening aspect ratios increase, thicker conductive material layers must be deposited, usually by DC magnetron sputtering, to obtain the required amount and depth of conductive material on the active-device region at the bottom of the contact opening. However, with contact openings approaching dimensions of 0.25 $\mu$m in diameter and aspect ratios of greater than 4 to 1, currently utilized processing techniques, such as physical vapor deposition, do not provide adequate step coverage for depositing conductive materials. Even the use of filtering techniques, such as physical collimated deposition and low-pressure long throw techniques, which are used to increase the number of sputtered particles contacting the bottom of the contact opening, have proven ineffective for contact opening diameters less than about 0.35 $\mu$m (for 0.25 $\mu$m diameter contact opening, the deposition efficiency is less than about 15%) and as contact opening aspect ratios increase beyond about 3 to 1 (bottom step coverage of less than 20%). Both collimated deposition and low-pressure long throw techniques also tend to create excessive film buildup at the top corner or rim of the contact opening, causing shadowing of bottom corners of the contact opening. The result is little or no deposited film at the bottom corners of the contact opening and consequently poor step coverage. Although increasing collimator aspect ratio results in improved step coverage, it also reduces deposition rate which reduces product throughput and, in turn, increases the cost of the semiconductor device.

Recently, physical vapor deposition ("PVD") has been revived with the introduction of the Ionized Metal Plasma ("IMP") process. Ionizing sputtered metal particles allows for highly directional PVD for depositing material in contact openings with up to about 6 to 1 aspect ratios and having 0.25 $\mu$m diameter openings. The IMP process can result in up to about 70% bottom coverage and up to about 10% sidewall coverage, even with such high aspect ratios and small diameter contact openings.

As illustrated in FIG. 19, an apparatus 320 used in the IMP process consists of a deposition chamber 322 having a pedestal 324 to support a semiconductor substrate 326 to be coated and a target 328, such as a titanium plate. The pedestal 324 has an RF power bias source 330, the deposition chamber 322 includes an RF power source 332, and the target 328 has an RF or a DC power source 334.

In the IMP process, metal particles (atoms, ions, etc.) (not shown) are sputtered from the target 328. These metal particles pass through a high-density plasma 336 (e.g., usually between about $10^{11}/[cm^3]$ and $10^{12}/[cm^3]$) formed between the target 328 and semiconductor substrate 326 where they become ionized. The ionization of the material particles enables a user to control the angular distribution of material arriving at the substrate for maximum coverage in the bottom of the contact openings (not shown) by the manipulation of the electric field at the substrate.

In the deposition chamber 322, the plasma 336 is maintained by inductively coupling RF energy from the RF power source 332 into the plasma 336. An electric field, or bias voltage, develops in a sheath layer 338 around the plasma 336, accelerating the metal ions (not shown) in a vector substantially perpendicular to the semiconductor substrate 326 by electrostatic coupling. The potential difference between the plasma 336 and the semiconductor substrate 326 can be optionally modulated by applying independent bias power from a pedestal power bias source 330 to the semiconductor substrate 326.

The degree of ionization of sputtered metal particles depends on their residence time in the plasma 336 (i.e., the longer the residence time, the greater the ionization). The sputtered atoms are ejected from the target 328 with relatively high energies (about 1 eV to 10 eV), leading to very short residence times. In order to slow down the metal particles for higher ionization, the process is usually operated at relatively high pressure (greater than about 10 mtorr). Such a pressure regime is higher than the 0.5–10 mtorr normally encountered in traditional PVD processes.

One drawback of the IMP process is the uniformity of the thickness of material deposited in the contact opening. When a contact opening is formed, a portion of the active material is also removed, as shown in FIG. 20. Elements common between FIGS. 14–18 and FIGS. 20 and 21 retain the same numeric designation. The uniformity of the IMP process results in a substantially level layer of conductive material 342 at the bottom 344 of the contact opening 308 with very little or no sidewall coverage at the active-device region 304. Thus, when a titanium silicide layer 346 is formed by a high temperature anneal, the titanium silicide layer 346 does not form on the sidewall portions 348 of the contact opening, which had little or no conductive material 342 thereon (see FIG. 21). Therefore, the contact area of the titanium silicide layer 346 is not maximized.

Thus, it can be appreciated that it would be advantageous to develop a technique and a contact interface to take advantage of the entire surface of the exposed active-device region in a contact opening to form a high surface area contact interface and, therefore, a more robust contact.

SUMMARY OF THE INVENTION

The present invention relates to altering an IMP process to form a contact interface within a contact opening, wherein the contact interface has a substantially continuous profile along a bottom and sides of the active surface of the semiconductor substrate. The contact interface is formed by depositing a layer of conductive material, such as titanium, using both a high bias deposition and a low bias deposition. The high bias and low bias deposition may be a two-step deposition or may be accomplished by moving the bias from a high level to a low level during deposition, or vice versa. The conductive material is preferably subsequently turned to a silicide by an annealing process to form the contact interface.

In an exemplary method of the present invention, a semiconductor substrate, having a contact opening through a dielectric layer to contact an active-device region on the semiconductor substrate, is placed on a pedestal within an IMP deposition chamber. A DC power source, coupled to a conductive material target such as titanium, is preferably set between about 1 and 3 kilowatts and an RF power source is preferably set between about 2 and 3 kilowatts. A pedestal power bias source is set to deliver a relatively high pedestal bias power of about 500 watts which results in a build-up of titanium at corners and lower sidewall portions of the contact opening. The high pedestal bias power deposition is followed by a low pedestal bias power deposition. A relatively low pedestal bias power of about 200 watts normally results in a convex or curved shape to the titanium layer when deposited in a contact opening. However, since the high pedestal bias power deposition has previously formed the titanium build-up at the corners and the lower sidewall portions of the contact opening, the subsequent deposition at a low pedestal bias power forms a substantially level profile across a bottom of the contact opening rather than forming a convex shape. Thus, the two-step process results in a titanium layer profile which substantially covers the bottom and the lower sidewall portions of the contact opening in a substantially concave shape.

After deposition, the semiconductor substrate is subjected to a high temperature anneal to form a titanium silicide layer and the unreacted titanium layer. The unreacted titanium layer may be removed (optional) and a contact is completed by depositing a metal or other such conductive material in the contact opening.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

FIGS. 1–13 illustrate various structures and contact interface formations of the present invention. It should be understood that the illustrations are not meant to be actual views of any particular semiconductor device, but are merely idealized representations which are employed to more clearly and fully depict the formation of contact interfaces in the present invention than would otherwise be possible. Additionally, elements common between FIGS. 1–13 retain the same numerical designation.

Although the examples presented are directed to the formation of titanium silicide contact interfaces, any metal or metal alloy which is capable of forming a silicide may be employed.

EXAMPLE

Figure 1:
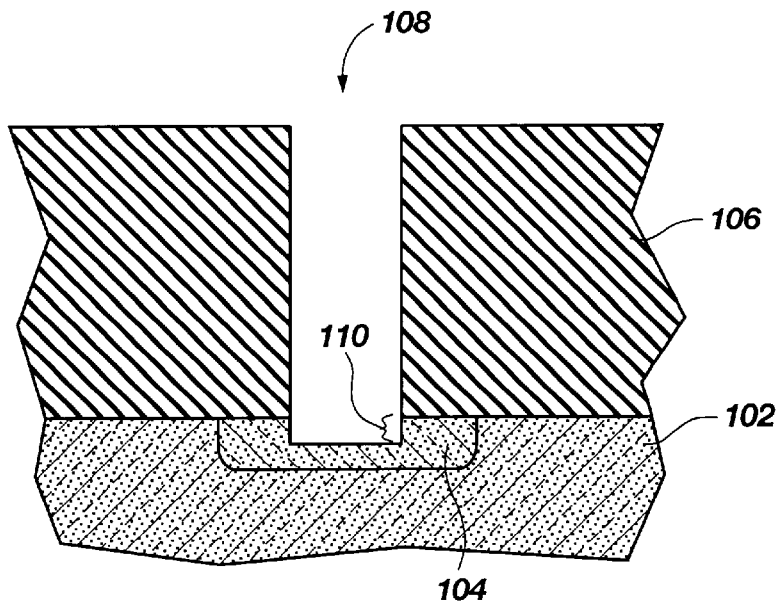
FIG. 1 is a cross-sectional view of a semiconductor substrate having an active-device region implanted therein and a dielectric layer disposed thereover with a contact opening therethrough.

Referring to FIG. 1, a test semiconductor substrate 102 (i.e., a silicon wafer) was formed with an active-device region 104 implanted therein and at least one dielectric layer 106 disposed thereover. At least one contact opening 108 (having a diameter of 0.35 μm and an aspect ratio greater than 4 to 1) was formed through the dielectric layer 106, by a known patterning and etching technique, to expose the active-device region 104, which also results in a recess 110 in the active-device region 104 caused by the etching technique.

Figure 2:
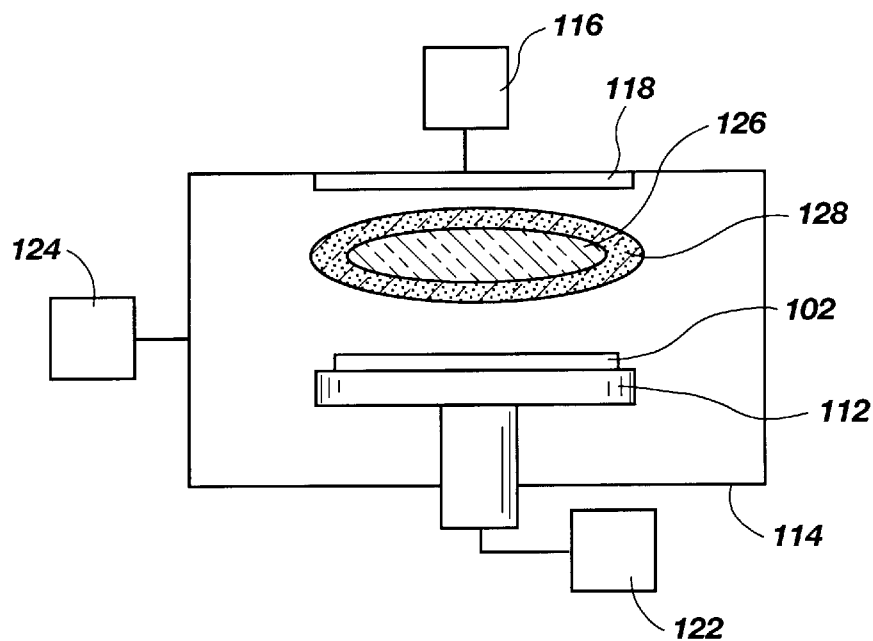
FIG. 2 is a schematic of an IMP system.
Figure 19:
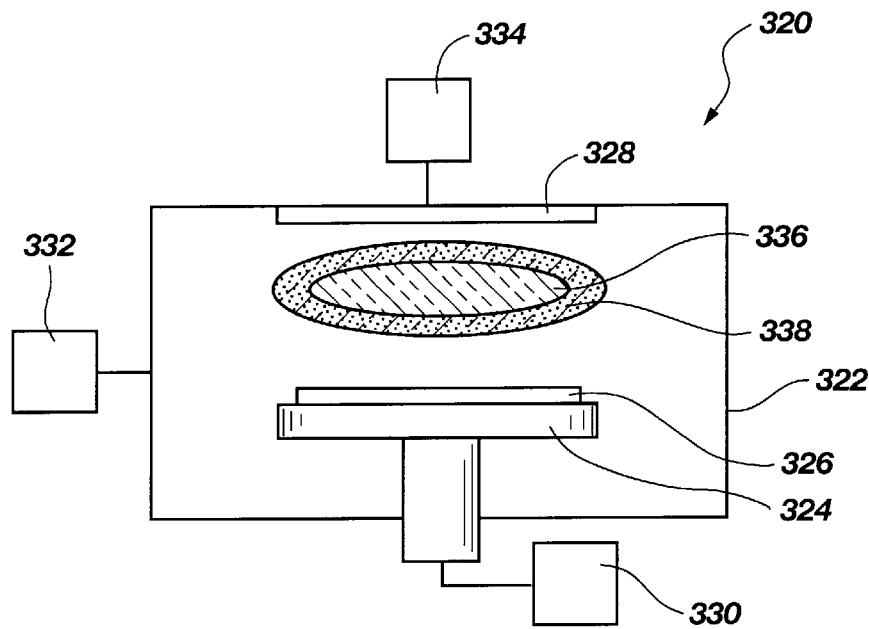
FIG. 19 is a schematic of an IMP system.
Figure 20:
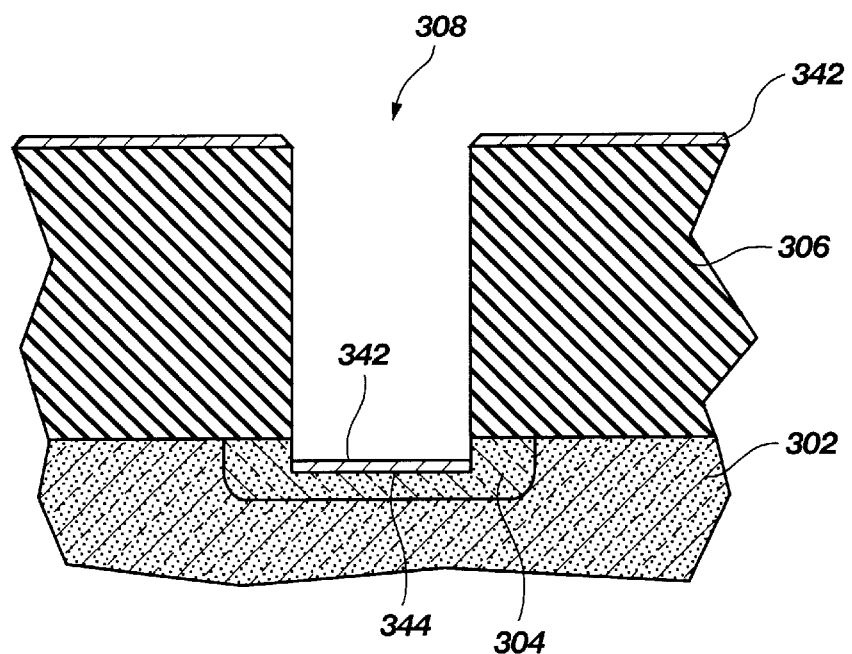
FIG. 20 is a cross-sectional view of a titanium layer formed by an IMP system.
Figure 21:
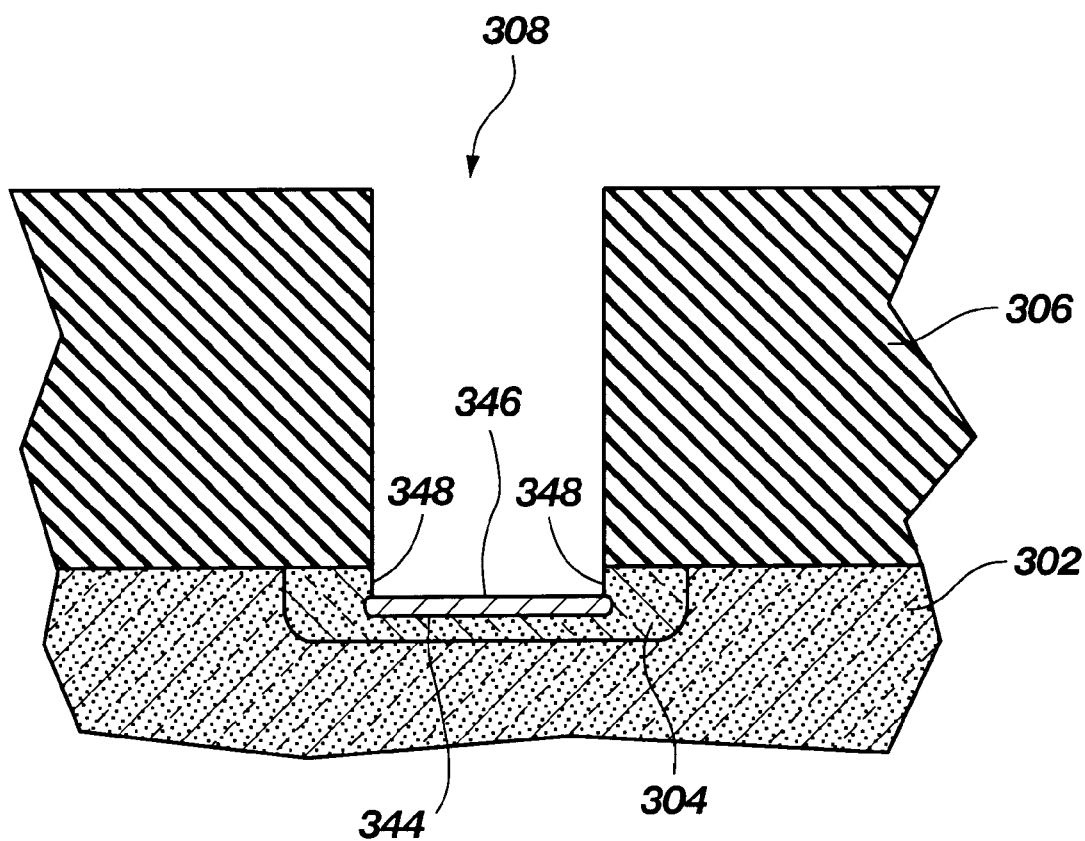
FIG. 21 is a cross-sectional view of the titanium layer having been formed into a titanium silicide layer by an annealing process.

As shown in FIG. 2, the test semiconductor substrate 102 was placed on a pedestal 112 within an IMP deposition chamber 114 (as also illustrated in FIG. 19). Preferably, the test semiconductor substrate 102 was placed in a hydrofluoric acid dip (prior to placement in the IMP deposition chamber 114) in order to remove native oxides from the contact opening 108. It is known that thin layers of native oxide will grow immediately after the removal of the test semiconductor substrate 102; however, the hydrofluoric acid dip will remove any previously formed native oxides or build-up thereof.

A DC power source 116, coupled to a titanium target 118, was set at approximately 2.0 kilowatts and an RF power source 124 was set at approximately 21 kilowatts. A pedestal bias power generated from a pedestal bias power source 122, coupled to the pedestal 112, was varied from about 100–300 watts to about 400–600 watts, as will be discussed. The IMP deposition chamber 114 was maintained at a temperature of about 200° C.

As particles of titanium (not shown) are sputtered from the titanium target 118, they are ionized to a positive charge while residing in a plasma 126 formed between the titanium target 118 and the test semiconductor substrate 102. Thus, any negative voltage on the pedestal 112 will accelerate the titanium ions toward the pedestal 112. These titanium ions strike the test semiconductor substrate 102 atop the pedestal 112 forming a titanium layer. A self-bias voltage of approximately −20 volts will be inherently present on the pedestal 112 at these operating parameters, even with no pedestal bias power is applied. As the pedestal bias power is increased, an increasing pedestal bias voltage will be present.

Figure 3:
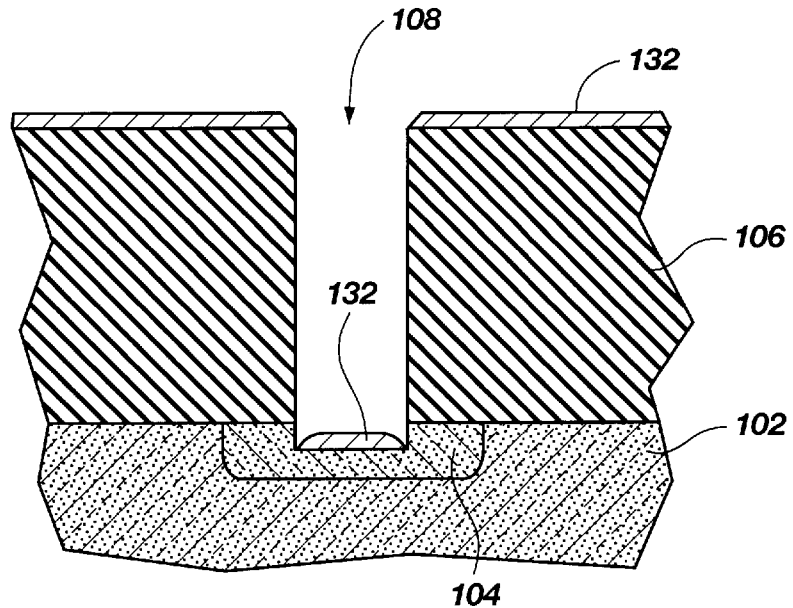
FIG. 3 is a cross-sectional view of a titanium layer formed in an IMP system with a low pedestal bias power.
Figure 4:
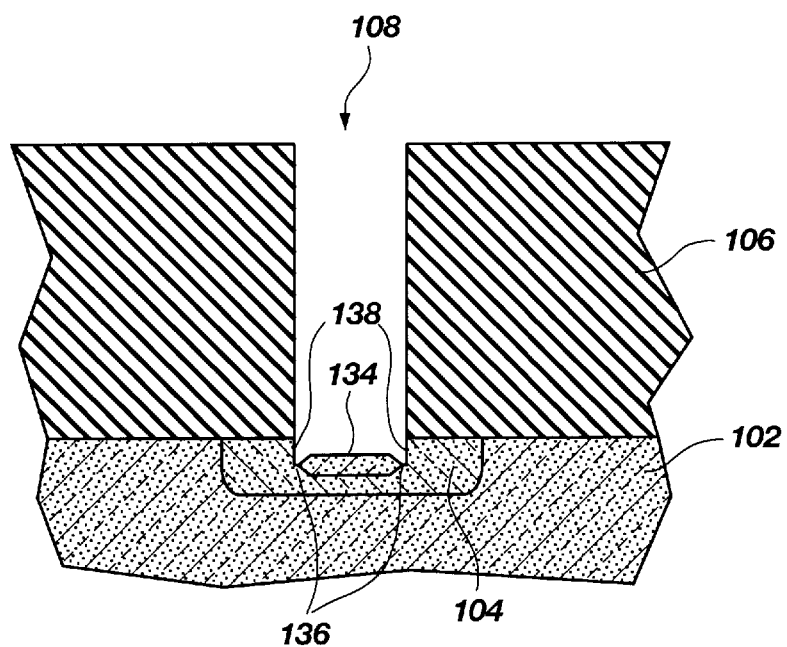
FIG. 4 is a cross-sectional view of a titanium silicide layer formed from the titanium layer of FIG. 3.

FIG. 3 illustrates a titanium layer formed with a low pedestal bias power. It has been found that with a relatively low pedestal bias power of between about 100 and 300 watts, there is an insufficient voltage drop across a sheath 128 of the plasma 126 (see FIG. 2) to accelerate the titanium ions from the plasma sheath 128 such that they have sufficient speed to cause resputtering of a portion of a titanium layer 132 previously deposited in the contact opening 108. This results in a convex or curved shape to the titanium layer 132. When a titanium silicide layer 134 is formed by heating the test semiconductor substrate 102, as shown in FIG. 4, the titanium silicide layer 134 is relatively thin at the edges 136 of the contact opening 108. This thinning of the titanium silicide layer 134 toward the contact edges 136 can cause severe problems, especially in contact openings 108 that are recessed into the test semi conductor substrate 102, as shown in this example. Thinly silicided contact edges 136 and non-silicided regions 138 of the contact opening 108 can cause high contact resistance as the majority of the electrical current follows the path of least resistance which is through the titanium silicide layer 134. This results in what is know as "current crowding."

Figure 5:
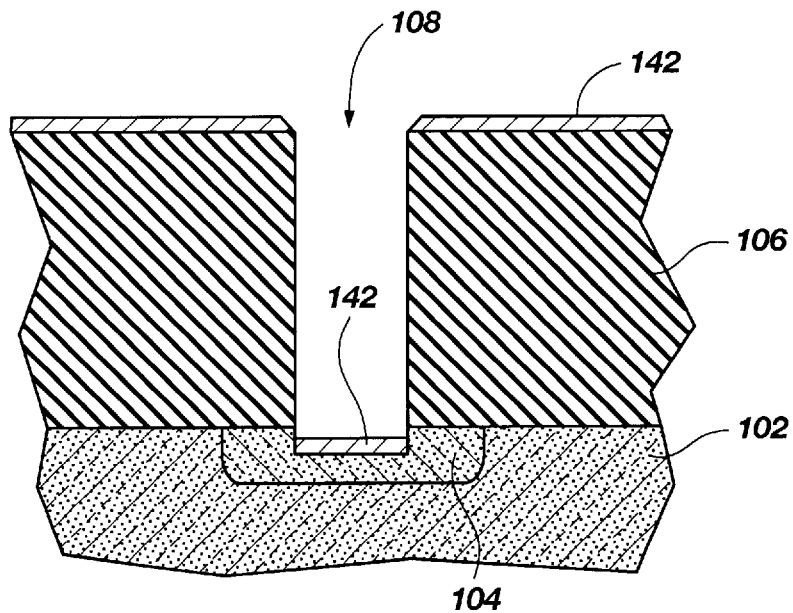
FIG. 5 is a cross-sectional view of a titanium layer formed in an IMP system with a medium pedestal bias power.
Figure 6:
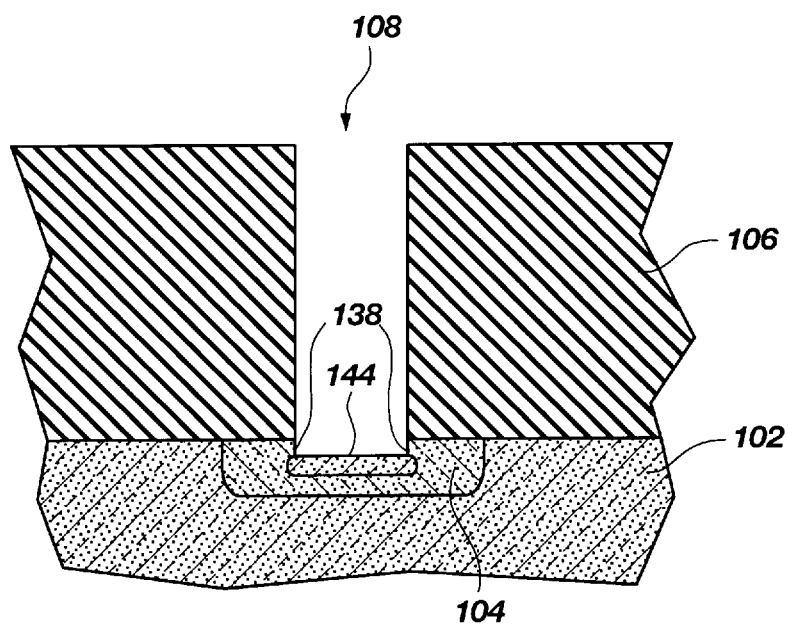
FIG. 6 is a cross-sectional view of a titanium silicide layer formed from the titanium layer of FIG. 5.

FIG. 5 illustrates a titanium layer formed with a medium pedestal bias power. It has been found that with a relatively medium pedestal bias power of between about 300 and 400 watts, a relatively uniform titanium layer 142 is formed. When a uniform titanium silicide layer 144 is formed by heating test the semiconductor substrate 102, as shown in FIG. 6, the uniform titanium silicide layer 144 also forms a relatively flat profile in the contact opening 108. However, if the contact opening 108 is sufficiently recessed, there will be non-silicided regions 138 in the contact opening 108. Although there is greater area of contact with the uniform titanium silicide layer 144 than with the titanium silicide layer 134 of FIG. 4, the uniform titanium silicide layer 144 still does not utilize all of the available contact surface of the active region in the contact opening 108 and current crowding may still occur.

Figure 7:
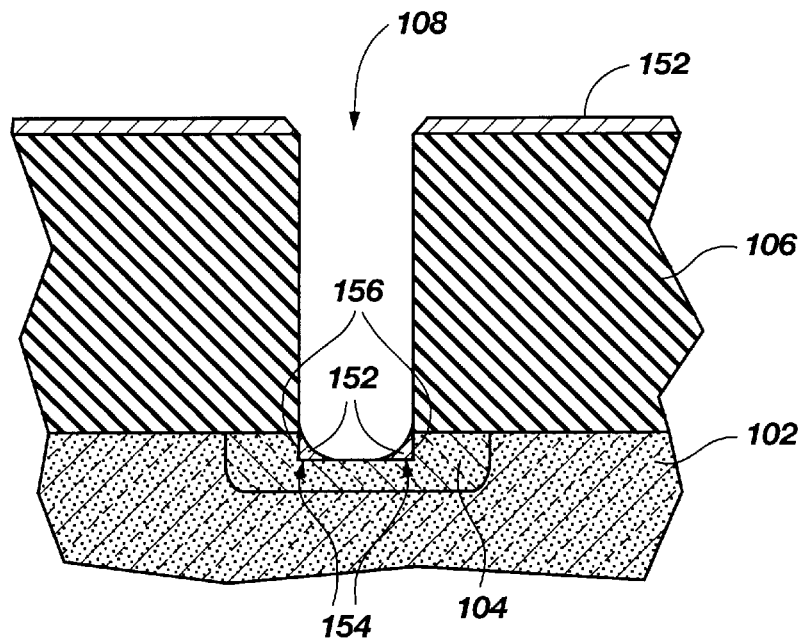
FIG. 7 is a cross-sectional view of a titanium layer formed in an IMP system with a high pedestal bias power.
Figure 8:
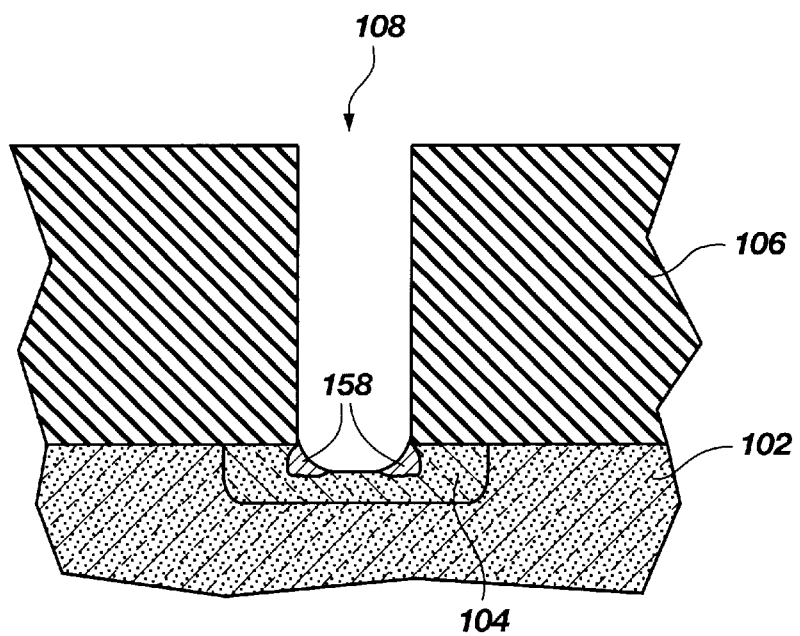
FIG. 8 is a cross-sectional view of a titanium silicide layer formed from the titanium layer of FIG. 7.

FIG. 7 illustrates a titanium layer formed with a high bias power. It has been found that with a relatively high pedestal bias power of about 300 watts, there is a high acceleration of the ionized titanium particles from the sheath 128 of the plasma 126 (see FIG. 2). The high acceleration causes resputtering of a previously deposited titanium layer. This results in a build-up of titanium 152 at corners 154 and lower sidewall portions 156 of the contact opening 108. For example, in a circular contact opening, the titanium build-up 152 would be annular in shape. When a titanium silicide layer 158 is formed by heating the test semiconductor substrate 102, as shown in FIG. 8, the titanium silicide layer 158 allows a very limited contact area. Again, such a limited contact area can cause high contact resistance as the majority of the current follows the path of least resistance through the annulus of titanium silicide layer 158.

Figure 9:
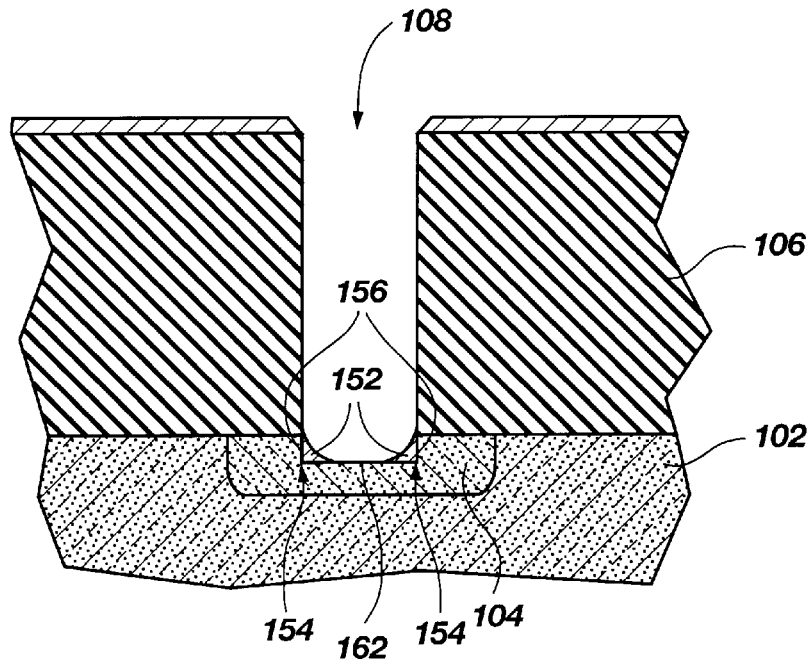
FIGS. 9–11 are cross-sectional views of an exemplary method for the formation of a contact interface of the present invention.
Figure 10:
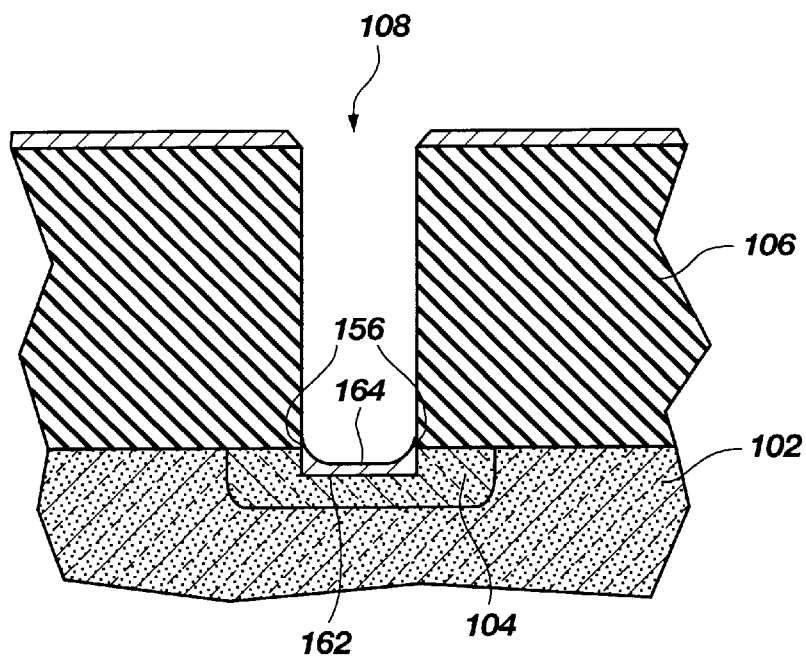
Figure 11:
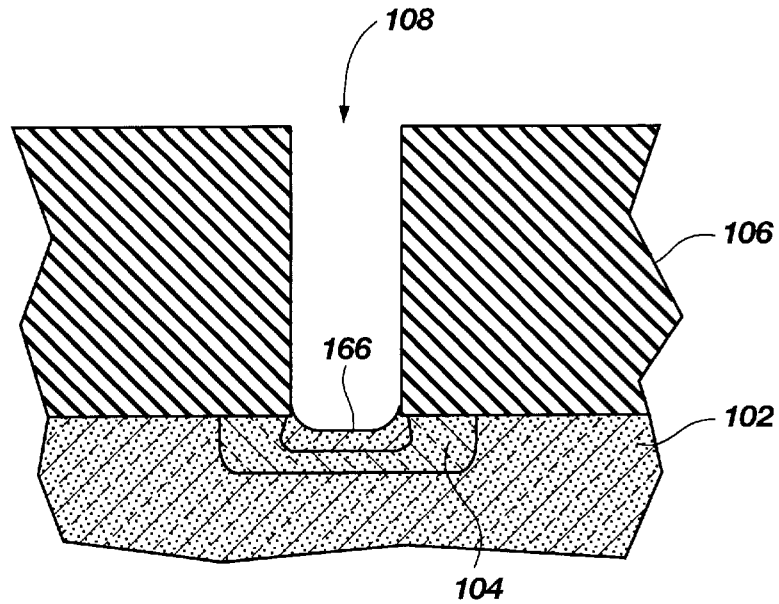

In response to these inefficient silicide profiles, a two-step process has been developed which results in a silicide profile that substantially covers the entire surface area of the bottom of a contact opening. The process consists of a high pedestal bias power deposition followed by a low pedestal bias power deposition, as illustrated in FIGS. 9–11. The pedestal power bias source 230 (see FIG. 2) is initially set to deliver a relatively high pedestal bias power of about 300 watts. FIG. 9 illustrates the profile of the titanium layer 152 achieved, which is also illustrated and discussed in FIGS. 7 and 8. As previously discussed, the high pedestal bias power results in a build-up of titanium 152 at the corners 154 and the lower sidewall portions 156 of the contact opening 108. Preferably, a pedestal bias power of between about 400 and 600 watts, for between about 20 and 40 seconds, is applied, wherein the time of deposition is dependent on the amount of titanium required in the contact opening.

The high pedestal bias power deposition is followed by a low pedestal bias power deposition. Preferably, a pedestal bias power of between about 100 and 300 watts, for between about 20 and 40 seconds, is applied, wherein the time of deposition is dependent on the amount of titanium required. As previously discussed in reference to FIG. 3, a relatively low pedestal bias power results in a convex or curved shape to the titanium layer. However, since the high pedestal bias power deposition has previously formed the build-up of titanium 152 at the corners 154 and the lower sidewall portions 156 of the contact opening 108, the deposition at a low pedestal bias power forms a substantially level profile of relatively constant depth across a bottom 162 of the contact opening 108. FIG. 10 illustrates the final profile of a titanium layer 164 after the low pedestal bias power step of the process. Thus, the two-step process results in a titanium layer 164 profile which substantially covers the bottom 162 and the lower sidewall portions 156 of the contact opening 108 to a substantially consistent depth exhibiting a slightly concave shape at the bottom corners of the contact opening 108, extending up the lower sidewall portions 156 and covering the exposed surfaces of the active-device region 104.

After the two-step deposition process, the test semiconductor substrate 102 is subjected to a high temperature anneal, such as rapid thermal processing (RTP), to form a titanium silicide layer 166 and the unreacted titanium layer 152, as shown in FIG. 11.

The titanium silicide layer 166 formed by this process greatly increases the surface area of the contact with the active-device region 104 to reduce contact resistance. Furthermore, the titanium silicide layer 166 covers substantially all of the exposed active-device region 104 which eliminates or reduces the potential of fluorine attack, since free fluorine readily reacts with silicon to form tetrafluorosilane ($SiF_4$). Tetrafluorosilane is a volatile compound and evaporates readily, thereby removing the silicon from the active-device region 104. Fluorine does not attack titanium silicide. Thus, the titanium silicide acts as a barrier layer protecting the active-device region 104.

It is, of course, understood that the two-step process could be replaced by a continuous metal deposition while adjusting the pedestal bias power from a high pedestal bias power (i.e., between about 400 and 600 watts) down to a low pedestal bias power (i.e., between about 100 and 300 watts) using manual control or with an automatic controller having a ramp function or the like. Additionally, although a process which moves from a high pedestal bias power to a low pedestal bias power is preferred, it is understood that the process can be reversed, such that the low pedestal bias power deposition is followed by a high pedestal bias power deposition.

Figure 12:
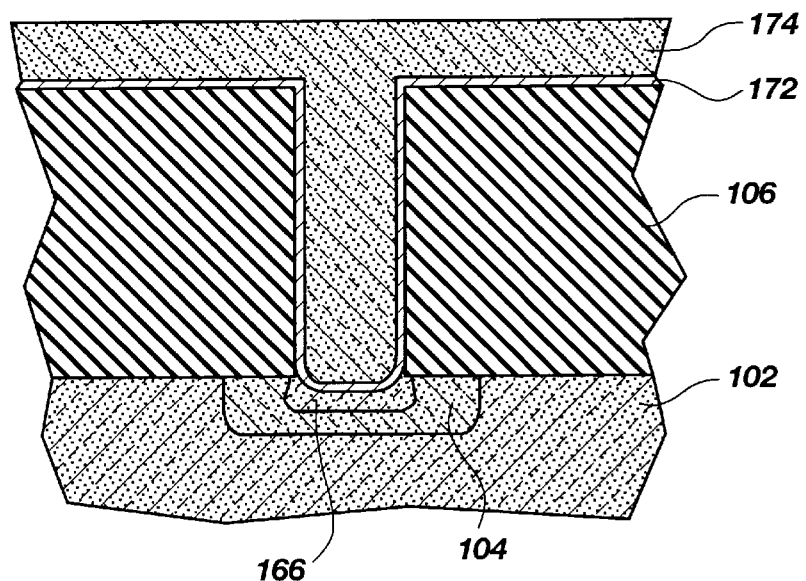
FIG. 12 is a cross-sectional view of a contact formed over the contact interface formed by the method illustrated in FIGS. 9–11.

Additionally, to complete the fabrication of a contact, as shown in FIG. 12, a layer of titanium nitride 172 is deposited, such as by chemical vapor deposition or physical vapor deposition, over the dielectric layer 106 and into the contact opening 108. The contact opening 108 is then filled with a conductive material 174, such as tungsten, by a conventional process, such as chemical vapor deposition.

Figure 13:
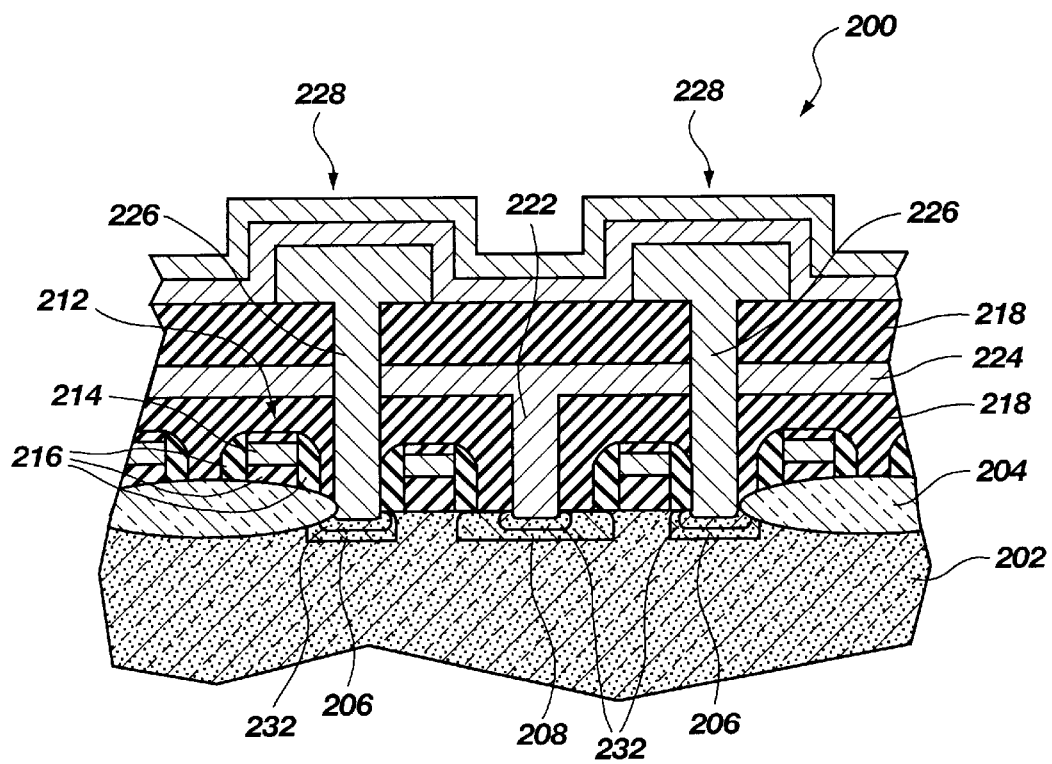
FIG. 13 is a cross-sectional view of a memory array of a DRAM chip utilizing the contact interfaces of the present invention.
Figure 14:
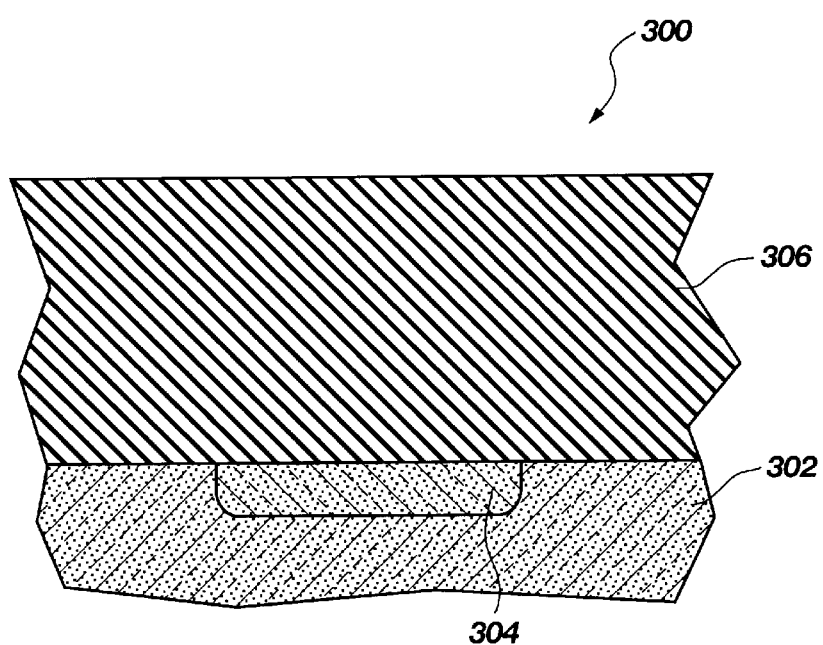
FIGS. 14–18 are cross-sectional views of a prior art method of forming a titanium silicide layer in a contact opening.
Figure 15:
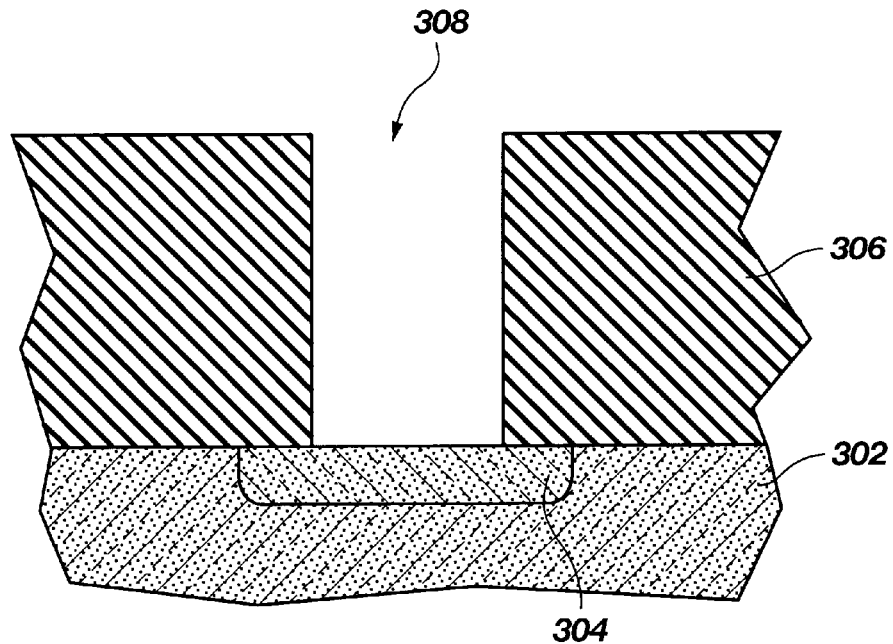
Figure 16:
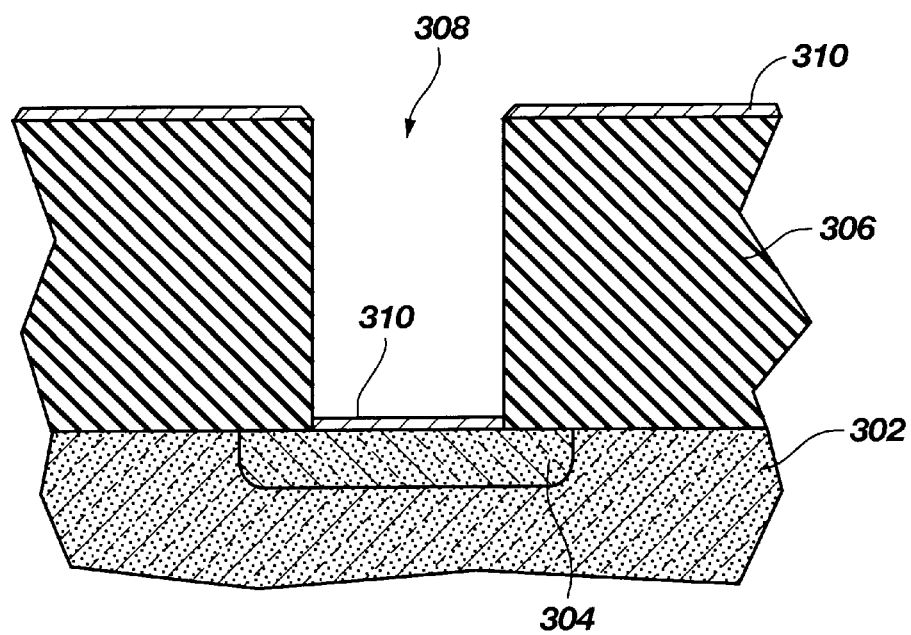
Figure 17:
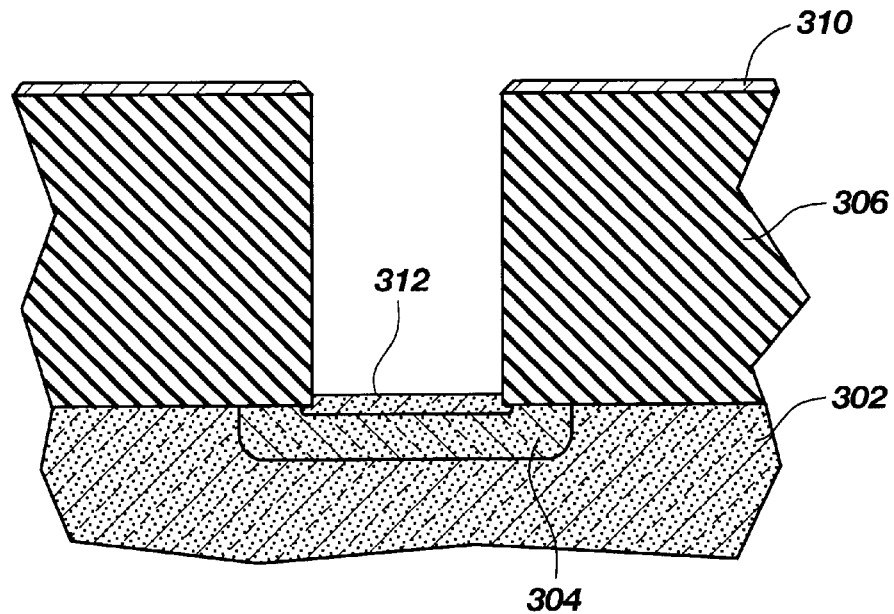
Figure 18:
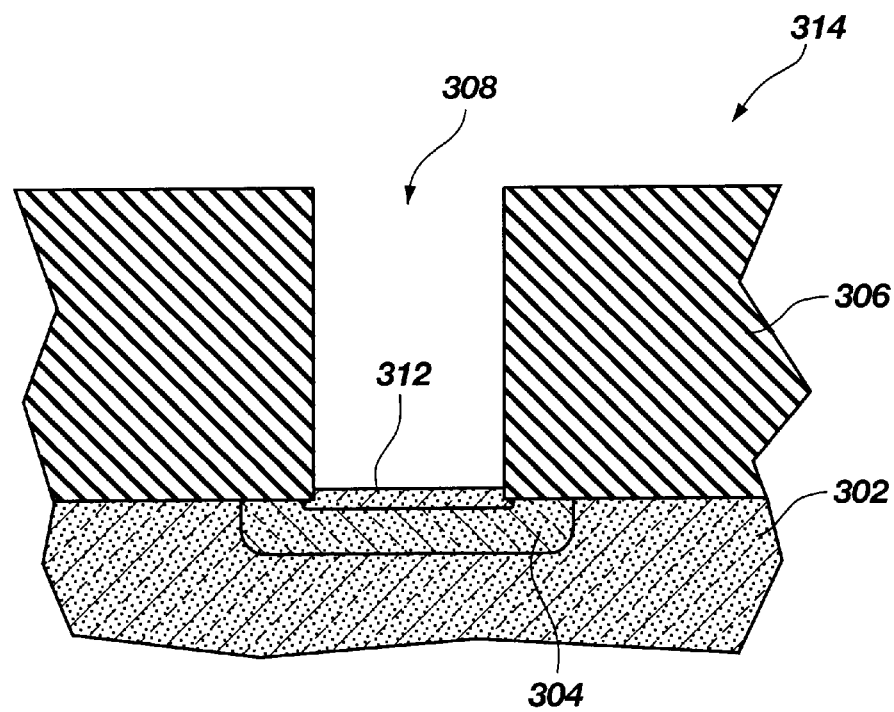

Furthermore, it is contemplated that the process of the present invention is useful for production of DRAM chips, wherein the contact interfaces are used in the CMOS structures within a memory array of a DRAM chip. Such a CMOS structure 200 is illustrated in FIG. 13 as a portion of a memory array in a DRAM chip. The CMOS structure 200 comprises a semiconductor substrate 202, such as a lightly doped P-type crystal silicon substrate, which has been oxidized to form thick field oxide areas 204 and exposed to implantation processes to form drain regions 206 and source regions 208. Transistor gate members 212, including a wordline 214 bounded by insulative material 216, are formed on the surface of the semiconductor substrate 202. A barrier layer 218 is disposed over the semiconductor substrate 202, the thick field oxide areas 204, and the transistor gate members 212. The barrier layer 218 has bitline contacts 222 contacting the source regions 208 for electrical communication with a bitline 224, and, further, has capacitor contacts 226 contacting the drain regions 206 for electrical communication with capacitors 228. Each of the bitline contacts 222 and capacitor contacts 226 may have silicide layer interfaces 232 formed, as described above, for reducing resistance between the bitline contacts 222 and the source regions 208, and between the capacitor contacts 226 and the drain regions 206.

Having thus described in detail preferred embodiments of the present invention, it is to be understood that the invention defined by the appended claims is not to be limited by particular details set forth in the above description, as many apparent variations thereof are possible without departing from the spirit or scope thereof.

What is claimed is:

1. A method of forming a contact interface for a semiconductor device, comprising:

providing a semiconductor substrate having a dielectric layer thereover, wherein at least one contact opening extends through said dielectric layer and into an active-device region in said semiconductor substrate; and depositing a conductive material in said at least one contact opening with an IMP process employing variation of a pedestal bias between a high bias power and a low bias power wherein depositing said conductive material includes depositing a portion of said conductive material at a high bias power and depositing a portion of said conductive material at a low bias power.

2. The method of claim 1, wherein said high bias power includes wattages between about 400 watts and about 600 watts.

3. The method of claim 1, wherein said low bias power includes wattages between about 100 watts and about 300 watts.

4. The method of claim 1, wherein depositing said conductive material includes depositing a portion of said conductive material at said high bias power followed by depositing a portion of said conductive material at said low bias power.

5. The method of claim 1, wherein depositing said conductive material includes depositing a portion of said conductive material at said low bias power followed by depositing a portion of said conductive material at said high bias power.

6. The method of claim 1, wherein depositing said conductive material includes varying said pedestal bias from said high bias power to said low bias power during a continuous deposition of said conductive material.

7. The method of claim 1, wherein depositing said conductive material includes varying said pedestal bias from said low bias power to said high bias power during a continuous deposition of said conductive material.

8. The method of claim 1, wherein said conductive material comprises titanium.

9. The method of claim 1, further comprising annealing said semiconductor substrate.

10. The method of claim 9, wherein said conductive material forms a silicide material.

11. A method of forming a contact, comprising:

providing a silicon-containing semiconductor substrate having a dielectric layer thereover, wherein at least one contact opening extends through said dielectric layer and into an active-device region in said silicon containing semiconductor substrate;

depositing a first conductive material in said at least one contact opening with an IMP process employing variation of a pedestal bias between a high bias power and a low bias power wherein depositing said conductive material includes depositing a portion of said conductive material at a high bias power and depositing a portion of said conductive material at a low bias power;

annealing said silicon-containing semiconductor substrate to react said first conductive material with said active-device region to form a silicide material; and depositing a second conductive material in said at least one contact opening.

12. The method of claim 11, wherein said high bias power includes wattages between about 400 watts and about 600 watts.

13. The method of claim 11, wherein said low bias power includes wattages between about 100 watts and about 300 watts.

14. The method of claim 11, wherein depositing said first conductive material includes depositing a portion of said first conductive material at said high bias power followed by depositing a portion of said first conductive material at low bias power.

15. The method of claim 11, wherein depositing said first conductive material includes depositing a portion of said first conductive material at said low bias power followed by depositing a portion of said first conductive material at said high bias power.

16. The method of claim 11, wherein depositing said first conductive material includes varying said pedestal bias from said high bias power to said low bias power during a continuous deposition of said first conductive material.

17. The method of claim 11, wherein depositing said first conductive material includes varying said pedestal bias from said low bias power to said high bias power during a continuous deposition of said first conductive material.

18. The method of claim 11, further comprising annealing said semiconductor substrate.

19. A method of forming a DRAM chip, comprising:

providing a silicon-containing semiconductor substrate having a dielectric layer thereover, wherein at least one contact opening extends through said dielectric layer and into an active-device region in said silicon containing semiconductor substrate;

depositing a first conductive material in said at least one contact opening to contact said active-device region by an IMP process wherein a pedestal bias is varied between a high bias power and a low bias power wherein depositing said conductive material includes depositing a portion of said conductive material at a high bias power and depositing a portion of said conductive material at a low bias power;

annealing said silicon-containing semiconductor substrate to react said first conductive material to form a silicide material; and depositing a second conductive material in said at least one contact opening.

* * * * *

UNITED STATES PATENT AND TRADEMARK OFFICE
CERTIFICATE OF CORRECTION

PATENT NO. : 6,121,134
DATED : September 19, 2000
INVENTOR(S) : Randle D. Burton and Shane Leiphart It is certified that error appears in the above-identified patent and that said Letters Patent is hereby corrected as shown below:

Title page,
Item [56], References Cited, U.S. PATENT DOCUMENTS, "5,773,890" before "6/1998" insert -- * --; "5,877,086" before "3/1999" insert -- * --; "5,895,267" before "4/1999" insert -- * --; "5,913,145" before "6/1999" insert -- * --; and after last cited U.S. PATENT DOCUMENT insert -- * cited by examiner --

Column 6,
Line 2, before "applied" delete "is"
Line 19, change "semi conductor" to -- semiconductor --
Line 31, change "test the" to -- the test --

Column 9,
Line 36, after "at" and before "low" insert -- said --

Signed and Sealed this

Twenty-seventh Day of January, 2004

JON W. DUDAS
*Acting Director of the United States Patent and Trademark Office*